United States Patent [19]
Yang

[11] Patent Number: 5,838,534
[45] Date of Patent: Nov. 17, 1998

[54] ELECTRONIC APPLIANCE HAVING AN EASY TO DISASSEMBLE FASTENER CAP

[75] Inventor: Dong-Wook Yang, Suwon, Rep. of Korea

[73] Assignee: SamSung Electronics Co., Ltd., Kyungki-do, Rep. of Korea

[21] Appl. No.: 853,866

[22] Filed: May 9, 1997

[30] Foreign Application Priority Data

May 9, 1996 [KR] Rep. of Korea .................. 1996 11213

[51] Int. Cl.$^6$ ....................................................... G02B 1/00
[52] U.S. Cl. ........................... 361/600; 361/658; 361/654; 24/113 R; 24/113 MP; 411/373; 411/429
[58] Field of Search ..................................... 361/600, 653, 361/654, 667; 411/429, 373; 24/113 R, 113 MP

[56] References Cited

U.S. PATENT DOCUMENTS

| | | | |
|---|---|---|---|
| 3,571,843 | 3/1971 | Szabo | 16/115 |
| 4,214,414 | 7/1980 | Wendt | 52/288 |
| 4,683,670 | 8/1987 | Bates | 40/620 |
| 4,887,787 | 12/1989 | Friedrichs | 248/551 |
| 4,989,806 | 2/1991 | Eggebeen | 242/199 |
| 5,100,188 | 3/1992 | Stieg | 293/115 |
| 5,112,175 | 5/1992 | Wilkening | 411/371 |
| 5,181,817 | 1/1993 | Anderson | 411/369 |
| 5,184,928 | 2/1993 | Tsukada | 411/371 |
| 5,407,310 | 4/1995 | Kassouni | 411/107 |

*Primary Examiner*—Leo P. Picard
*Assistant Examiner*—Boris L. Chervinsky
*Attorney, Agent, or Firm*—Robert E. Bushnell, Esq.

[57] ABSTRACT

In the installation and removal of a fastener cap for covering a fastener which makes a front cover constructed as a first cover and a back cover constructed as a second cover fixed to each other by a fastener such as screw, which would appear on the exterior of products, the fastener cap is easily disassembled from the covers without marring the exterior of products, while maintaining an attractive appearance thereof. A back cover 20 which is coupled to a front cover 10 by means of a screw fastener 40, includes a fastener well 21 having a front assembly groove 23 and a back assembly groove 25 into which a front assembly projection 31 and a back assembly projection 32 on fastener cap 30 are respectively inserted during assembly. A supporting rib 33 on the fastener cap 30 is formed to be stopped by a push preventing projection 26 formed at the bottom of the fastener swell 21, so that the supporting rib 33 is stopped by the push preventing projection 26 to serve as a fulcrum when pressing the back assembly projection 32 of the fastener cap 30. As a result, the front portion of the fastener cap 30 is lifted above the surface of the cover, thereby allowing the removal of the fastener cap 30.

6 Claims, 5 Drawing Sheets

ELECTRONIC APPLIANCE HAVING AN EASY TO DISASSEMBLE FASTENER CAP

CLAIM OF PRIORITY

This application makes reference to, incorporates the same herein, and claims all benefits accruing under 35 U.S.C. §119 from an application entitled *Electronic Appliance Having An Easy to Disassemble Fastener Cap* earlier filed in the Korean Industrial Property Office on the $9^9$ day of May 1996, and there duly assigned Ser. No. 1996-11213 by that Office, a copy of which application is annexed hereto and made a part hereof.

BACKGROUND OF THE INVENTION

1. Field of the Invention

The present invention relates to a cap for covering holes for fasteners, and, more particularly, to processes and self-retaining caps for forming a flush cover of holes that accommodate threaded fasteners connecting the front and back portions of two-piece electronic appliance covers.

2. Discussion of Related Art

In general, electronic appliances such as monitors and television receivers are encased in a housing constructed with two piece covers having a front portion and a back portion that may be attached to each other with threaded fasteners such as screws. The back cover usually includes a well into which the fastener is inserted to couple the front portion and the back portion of the housing. The well and the fastener are externally visible from the exterior of the appliance, thereby detracting from its visual aesthetics. Efforts to improve the aesthetics have sought to cover the fastener in order to make the exterior of products better looking, since the fastener cap is assembled by insertion into the well formed on the back cover. I have found that it is frequently necessary when trying to remove the cap, to use a metal pin or pry bar that is inserted into the gap between sides of the fastener well and the fastener cap. Moreover, it is usually necessary to pull so that assembly projections are separated from their respective grooves, or alternatively, to pry the assembly projections free from their assembly grooves; consequently, the back cover is all too frequently damaged during removal. As a result, when the fastener cap is removed prior to shipment of the products, there is often a subsequent accompanying loss of parts with an expensive concomitant loss of efficiency in the manufacturing process due to the need to then replace the back cover. After shipment, it is difficult to correct these deficiencies. Recent efforts, such as the Screw Hole Plug of S. R. Wilkening, U.S. Pat. No. 5,112,175, have relied upon caps that engage the heads of threaded fasteners, and thus inconveniently limited the access to the wall of the cover provided by the orifice of the screw hole. Other efforts, namely the Fastener of G. E. Anderson, U.S. Pat. No. 5,181,817, have depended upon female threads formed in the cap, a design that I have found to be unnecessarily expensive.

SUMMARY OF THE INVENTION

Accordingly, the present invention is directed to an improved process and cap for covering fastener wells.

It is another object to provide a process and cap for covering fastener wells in electronic appliances, that enables easy installation and removal of the cap to and from the well.

It is still another object to provide a cap that retains itself after installation with a fastener well.

It is yet another object to provide a cap that may be manually removed from a fastener well without use of a tool.

It is still yet another object to provide an electronic appliance with a fastener cap that can be promptly and easily removed for repair and servicing, wherein the fastener cap covers fasteners for attaching a front cover to a back cover to make the exterior appearance of products more attractive.

It is also an object to provide a fastener well and cap for covering the well, that enables installation of threaded fasteners along an axis that is nearly orthogonal to the junction between front and rear covers of an electronic appliance.

It is a further object to provide a cap that forms a flush transition across a fastener well formed at a junction between front and rear covers of an electronic appliance.

These and other objects may be achieved with a cap conforming to a fastener well constructed at a junction between a front cover and a back cover including the fastener well, having a central projection disposed in the middle of the bottom of fastener well, a front assembly groove formed in one wall of the well in front of the projection, and a back assembly groove formed in the well wall behind the projection. The fastener cap includes a forward assembly projection formed on the front lower portion of the cap that may be inserted into the forward assembly groove, a rear assembly projection formed on the back lower portion of the cap that may be inserted into a rear assembly groove, and a supporting rib projecting from the inner middle portion of the cap to engage and be restrained by the projection. The projection serves as a fulcrum during removal of the cap when the rear portion of the cap is depressed. The forward assemble projection is made in the form of a semicircle, oval or triangle, so as to be easily pulled from the forward assembly groove. A mounting lip is formed on the forward upper portion of the fastener cap so that the front assembly projection and the periphery of the cap will not be depressed while the cap is being removed.

It is to be understood that both the foregoing general description and the following detailed description are exemplary and explanatory and are intended to provide further explanation of the invention as claimed.

BRIEF DESCRIPTION OF THE ATTACHED DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENT

Figure 1:
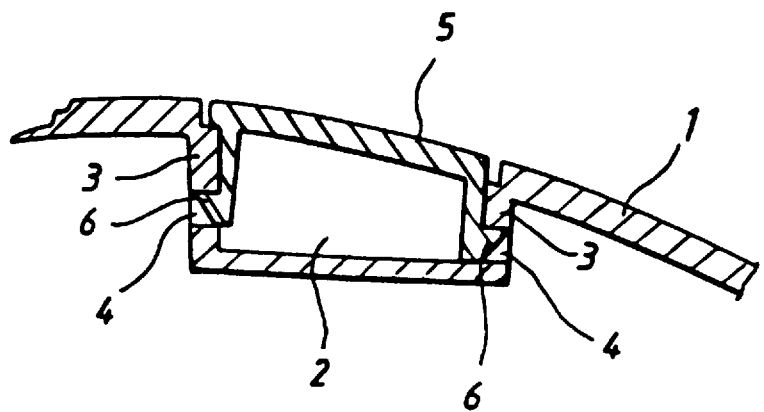
FIG. 1 is a cross-sectional view of a hypothetical conventional fastener cap.
Figure 2:
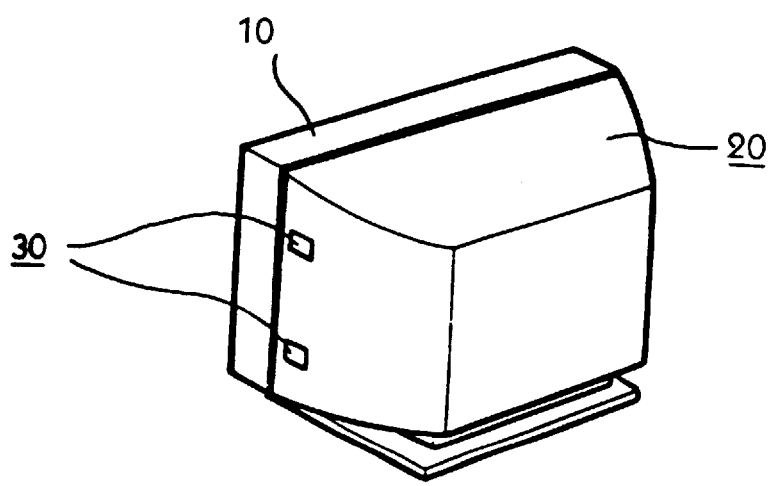
FIG. 2 is a perspective view of a monitor, in which several locations of assembled fastener caps are shown.
Figure 3:
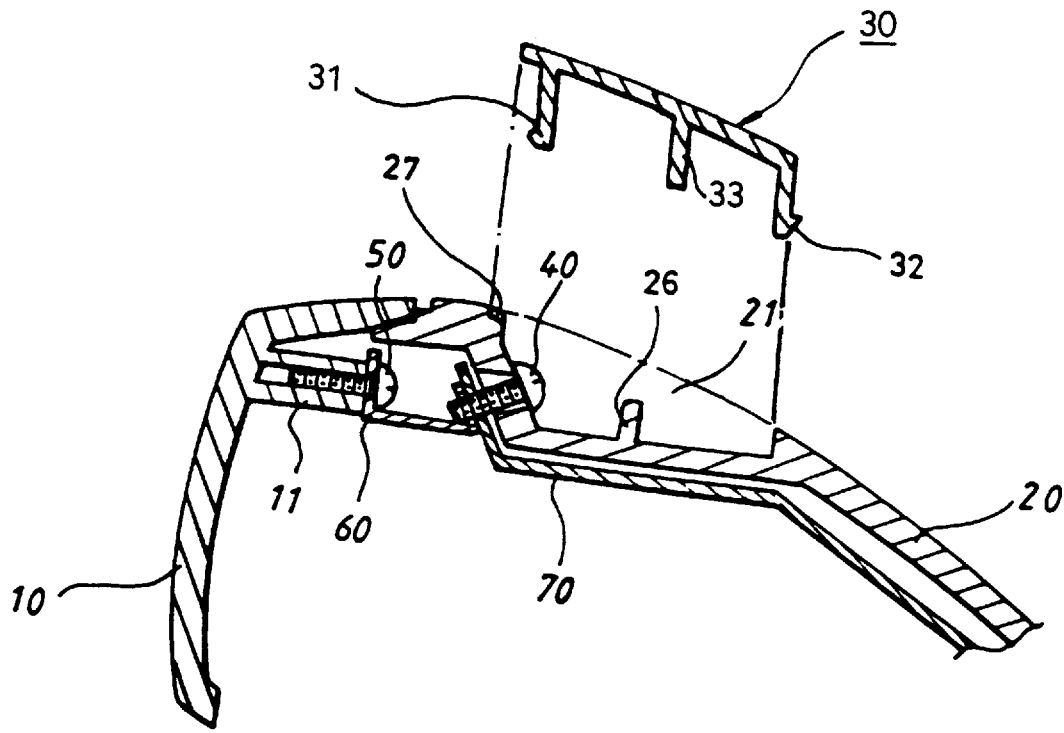
FIG. 3 is an exploded cross-sectional view of a fastener cap installed according to the principles of the present invention.
Figure 4:
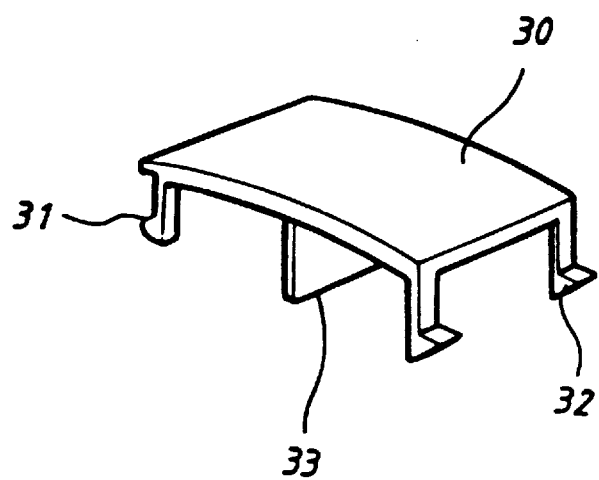
FIG. 4 is a perspective view of a fastener cap constructed according to the principles of the present invention.
Figure 5:
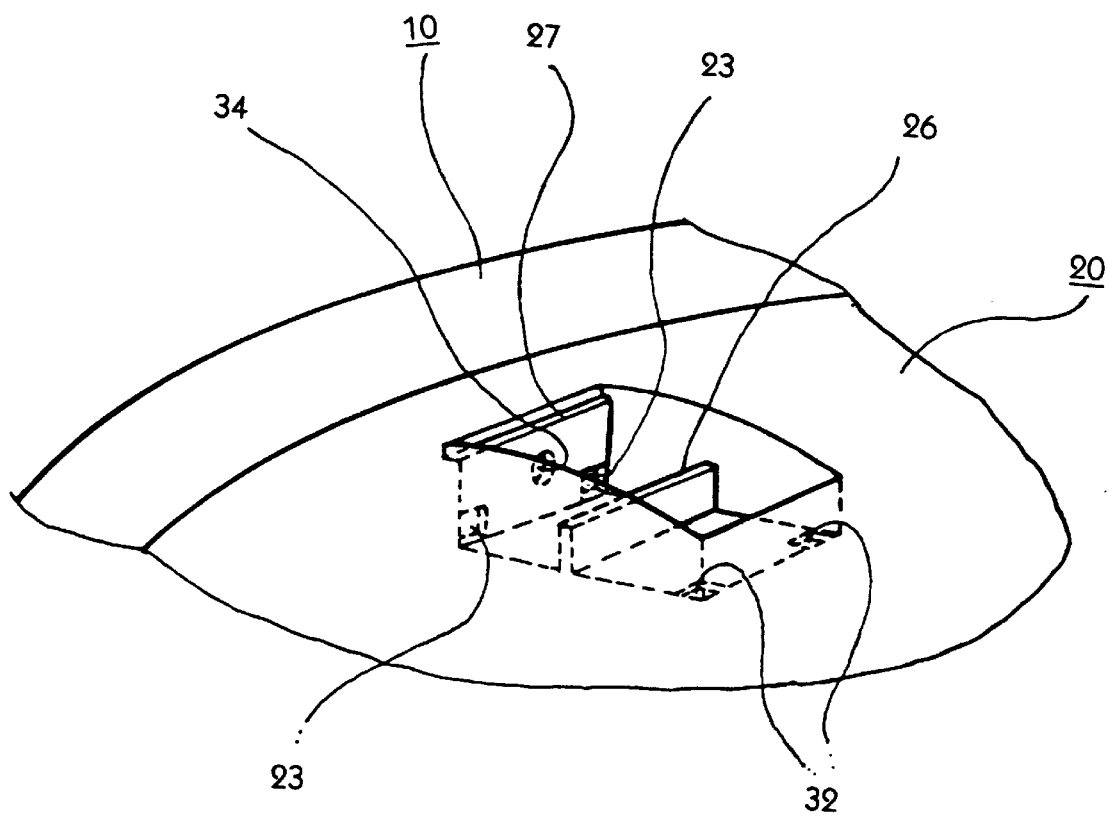
FIG. 5 is a perspective view of a fastener well constructed according to the principles of the present invention.

Reference will now be made in detail to the preferred embodiments of the present invention, examples of which are illustrated in the accompanying drawings. FIGS. 1 and 2 show a monitor, to which the conventional art is applied. A fastener well 2 is formed in back cover 1, assembly grooves 4 are formed at both sides of the fastener well 2, and assembly projections 6 formed on both sides of fastener cap 5, which is the same size as fastener well 2, are inserted into the assembly grooves 4, thus fixing the cap. The fastener well 2 is a screw installation space made for attaching the front cover to the back cover, and the fastener well 2 and screw are exposed to the exterior of back cover 1. A separate fastener cap 5 is often applied to cover well 2.

When the front cover and the back cover are disassembled for servicing the product, it is very difficult to remove assembly projections 6 of the fastener cap 5 from assembly grooves 4 of the back cover 1 once assembled. Therefore, a metal pin or pry bar is inserted into the gap between sides of the fastener well 2 and the fastener cap 5. It is necessary to pull the sides so that assembly projections 6 are separated from assembly grooves 4, or pry the assembly projections 6 free of the assembly grooves 4 so that the back cover 1 is damaged. When the fastener cap is removed prior to sending out products, there results a parts loss and an inefficient manufacturing process due to the replacement of the back cover itself. It is also difficult to disassemble the front cover and back cover at a customer's side during repair service, after sending out products.

Turning now to FIGS. 3 through 8, preferred embodiments of the present invention are illustrated with an electronic appliance that is encased in a housing formed by front cover 10 and back cover 20 including a fastener well 21 for attaching the front cover to the back cover with screw fastener 40. A front assembly groove 23 is formed in the front wall 22 of fastener well 21, and a back assembly groove 25 is formed in the back wall of fastener well 21. Fastener cap 30 includes a front assembly projection 31 formed on the front lower portion thereof to mate with front assembly groove 23, a back assembly projection 32 formed on the back lower portion thereof to lock into back assembly groove 25, and a supporting rib 33 projecting from the middle lower portion which is stopped by a push preventing projection 26 of the back cover 20 for rotating cap 30 like a lever around the distal end of projection 26 while depressing back assembly projection 32.

The front assembly projection 31 may be made in the form of a semicircle, oval or triangle, to be easily pulled from front assembly groove 23. A mounting lip 27 is formed at the top of the front of fastener well 21 so that the front assembly projection 31 and the periphery of the fastener cap 30 are not pressed. A front cover frame 60 is integrally fixed to a boss 11 on the front cover 10 by a fixing screw 50, and a back cover frame 70 is attached to the back cover 20, and then attached to the front cover frame 60 with the assembly screw 40 so that the front cover 10 and the back cover 20 are coupled with each other. The front cover frame 60, attached to the front cover 10, and the back cover frame 70, attached to the back cover 20, are attached to each other with the assembly screw 40 through fastener well 21 of the back cover 20.

Figure 6:
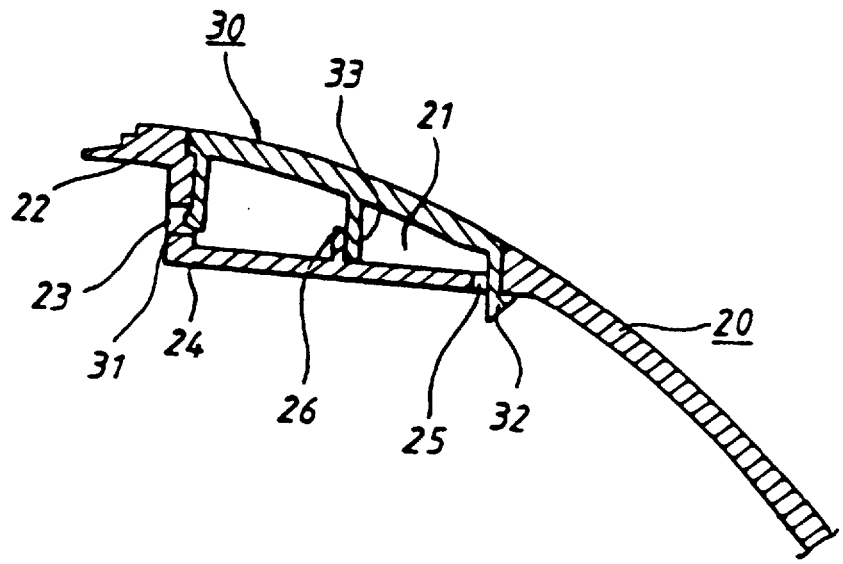
FIG. 6 is a cross-sectional view of a fastener cap installed according to the principles of the present invention.
Figure 7:
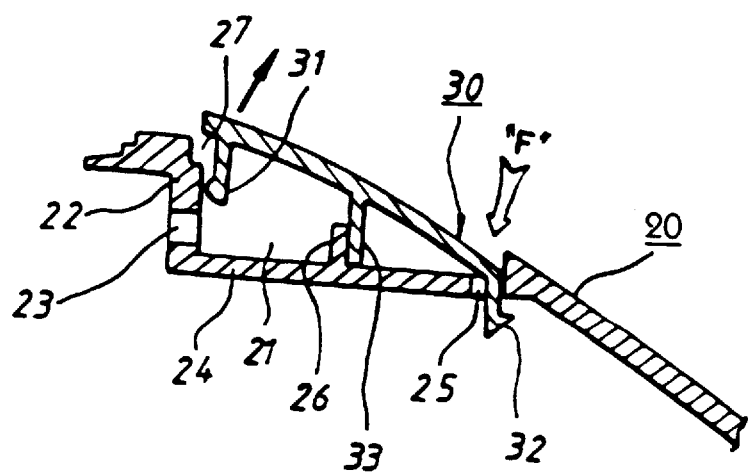
FIG. 7 is a cross-sectional view illustrating partial removal of a previously installed fastener cap according to the principles of the present invention.
Figure 8:
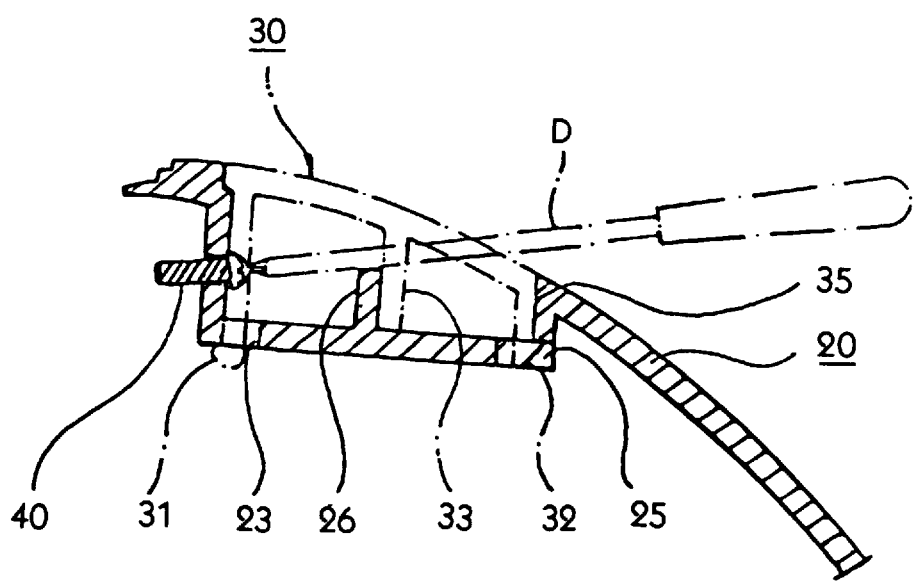
FIG. 8 is a cross-sectional view illustrating one aspect of an installation of a threaded fastener through a well that may be covered with a cap in accordance with the principles of the present invention.

After assembly of the monitor covers is completed, the fastener well 21 is covered with fastener cap 30, thereby improving the appearance of the cover. The front and back assembly projections 31 and 32 on fastener cap 30 are inserted into the front and back assembly grooves 23 and 25, respectively, and the supporting rib 33 of the fastener cap 30 is stopped by the back portion of the push preventing projection 26 of the back cover 20. This completes the assembly. The front and back assembly grooves 23 and 25 can be formed at the bottom, front or back of fastener well 21, as shown in FIGS. 6 and 8. The supporting rib 33 supports fastener cap 30 in order to prevent it from collapsing into fastener well 21; thus the back cover 20 is flush with fastener cap 30.

When the front cover and the back cover need to be disassembled for re-working and service resulting from defects in manufacturing, the back assembly projection 32 and the rear periphery fastener cap 30 are pressed, and the supporting rib 33 is stopped by the push preventing projection 26, which acts as a fulcrum. As a result, the back assembly projection 32 descends, and the front assembly projection 31 is pulled from the front assembly groove 23 and is exposed to the outside of the covers. The back assembly projection 32 also deviates from the back assembly groove 25 so that the fastener cap 30 can be simply and easily removed from the back cover 20. The front assembly projection 31 is made in the form of a semicircle, oval or triangle so that it can be easily pulled from the front assembly groove 23 and then can be simply removed. If the front assembly projection 31 and its periphery of the fastener cap 30 are pressed by mistake, the frontend of the fastener cap 30 sits on mounting lip 27 in order not to descend. Accordingly, the fastener cap 30 is removed from back cover 20, and then the assembly screw 40 is also removed through fastener well 21 so that the front cover 10 and the back cover 20 are disassembled. Following this, re-working or repair service can be performed.

As illustrated in FIG. 8, when the assembly screw 40 is installed by means of a screw driver D so that the front cover 10 and the back cover 20 may be assembled/disassembled, the push preventing projection 26 prevents the driver D from contacting with the fastener well top back edge 35 of fastener well 21, thereby preventing damage to back edge 35 caused by screw driver D. That is to say, the screw driver D is in contact with the push preventing projection 26 when installing or removing the screw fastener 40 so that the back edge 35 does not come into contact with screw driver D, and thus is not damaged.

As mentioned above, the improved fastener cap of the present invention can be easily removed during re-working or repair service, and consequently, manufacturing productivity is enhanced. Also, it can be manually disassembled without use of a metal pin or pry bar so that the exterior of the covers is not damaged, and thus damage to covers is reduced, thereby enhancing the reliability of products.

The present invention can also be applied to various kinds of electronic appliances with two-piece covers which are attached to each other with screw fasteners, as well as the monitor demonstrated herein as a preferred embodiment of the present invention. Therefore, the present invention should be protected within the scope of the claims.

The foregoing paragraphs describe the details of an invention relating to cap for covering holes for fasteners, and, more particularly, to processes and self-retaining caps for forming a flush cover of holes that accommodate threaded fasteners connecting the front and back portions of two-piece electronic appliance covers, such as those which cover computer monitors, which is easily removed for servicing while improving the appearance of the product. Preferred embodiments of the present invention contemplate a fastener cap for covering a fastener connecting the cover pieces to improve the appearance of the product, but the embodiments of the present invention are easily installed and removed. Therefore, the invention should be protected within the scope of the claims, regardless of configuration of the cover or fasteners.

It will be apparent to those skilled in the art that various modifications and variations can be made to an electronic appliance using a fastener cap which can be easily removed and installed without departing from the spirit or scope of the invention. Thus, it is intended that the present invention cover the modifications and variations of this invention provided they come within the scope of the appended claims and their equivalents.

What is claimed is:

1. An electronic appliance with a two-piece cover, comprising:
   a first cover; and
   a second cover coupled to the first cover with a fastener;
   the electronic appliance further comprising:
     a fastener well having a push preventing projection formed at a center of a bottom of said well, a front assembly groove formed on a front side of said push preventing projection, and a back assembly groove formed on a back side of said push preventing projection; and
     a fastener cap having a supporting rib projecting from a middle of said cap to engage said push preventing projection within said fastener well during insertion of said fastener cap into said well, a back assembly projection mating with said back assembly groove inside said fastener well, and a front assembly projection inserted into said front assembly groove inside said fastener well.

2. The electronic appliance as claimed in claim 1, further comprised of said front assembly projection of said fastener cap having a terminal portion made in a shape of a semicircle.

3. The electronic appliance as claimed in claim 1, comprising a mounting lip formed at a top of said fastener well of said second cover accommodating insertion of a distal end of said fastener cap while obstructing movement of said distal end into said fastener well whenever force is applied to depress said distal end toward said fastener well.

4. The electronic appliance as claimed in claim 1, comprised of said push preventing projection of the second cover having a height obstructing passage of a fastener tool toward contact with a back wall forming said back side of said fastener well of the second cover, whenever a fastener is installed, removed, or adjusted via said fastener well.

5. An electronic appliance with a two-piece cover comprising a first cover and a second cover,
   the first cover including a fastener well having a push preventing projection formed on the bottom thereof, a front assembly groove formed in front of the push preventing projection, and a back assembly groove formed in back of the push preventing projection,
   the electronic appliance further comprising a fastener cap inserted into the fastener well in the first cover, the fastener cap having a supporting rib projecting from the middle thereof to be stopped by the push preventing projection of the first cover when assembling, a back assembly projection mating with the back assembly groove in the second cover, and a front assembly projection assembled into the front assembly groove in the second cover, and wherein, when the back assembly projection and its periphery of the second cover are pressed, the front assembly projection of the second cover is pulled from the front assembly groove of the first cover so that the fastener cap can be easily removed.

6. A housing for an electronic appliance, comprising:
   a first case having a first exterior surface terminated by a depending portion;
   a second case having a second exterior surface and forming a junction abutting said depending portion, said second case having a well formed in a region of said second exterior surface with a forward wall descending from said second exterior surface to a bottom wall of said well, a back wall forming a transition between said second exterior surface and said bottom wall, and a projection extending from said bottom wall toward said second exterior surface, said forward wall being perforated by a first aperture;
   a junction between said bottom wall and said back wall forming a junction perforated by a second aperture;
   a cap insertable into said well to form a substantially flush transition between said first exterior surface and said second exterior surface while said first case is joined to said second case by a fastener inserted into said well, said cap being comprised of:
     an outer wall providing a major exterior surface and an inner surface separated by a thickness of said outer wall from said major exterior surface;
     a central wall integrally formed with said outerwall as a monolithic integrated structure, said central wall having a length enabling one side of said central wall to abut said projection while said cap forms said substantially flush transition;
     a forward leg integrally formed with said outer wall as a part of said monolithic integrated structure, said forward leg depending from said outer wall inwardly toward said bottom wall and being received within said first aperture while said cap forms said substantially flush transition; and
     a rear leg integrally formed with said outer wall as a part of said monolithic integrated structure, said rear leg terminated by tab receivable with said second aperture while said cap forms said substantially flush transition.

* * * * *